United States Patent
Kim et al.

(10) Patent No.: US 9,536,931 B2
(45) Date of Patent: Jan. 3, 2017

(54) ORGANIC LIGHT EMITTING DEVICE AND MANUFACTURING METHOD THEREOF

(75) Inventors: Il-Nam Kim, Yongin-si (KR);
Won-Sang Park, Yongin-si (KR);
Min-Woo Kim, Yongin-si (KR);
Jae-Kyoung Kim, Yongin-si (KR);
Hae-Yun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 447 days.

(21) Appl. No.: 13/614,826

(22) Filed: Sep. 13, 2012

(65) Prior Publication Data

US 2013/0187163 A1     Jul. 25, 2013

(30) Foreign Application Priority Data

Jan. 19, 2012 (KR) .................... 10-2012-0006169

(51) Int. Cl.
*H01L 29/04* (2006.01)
*H01L 27/32* (2006.01)
*H01L 51/52* (2006.01)

(52) U.S. Cl.
CPC ....... *H01L 27/3246* (2013.01); *H01L 27/3258* (2013.01); *H01L 51/5271* (2013.01); *H01L 51/5218* (2013.01); *H01L 2251/5315* (2013.01)

(58) Field of Classification Search
CPC ............. H01L 51/5271; H01L 27/3258; H01L 27/3246; H01L 51/5218; H01L 2251/5315
USPC .................. 257/59, 72, E51.018; 438/34
See application file for complete search history.

(56) References Cited

U.S. PATENT DOCUMENTS

| | | |
|---|---|---|
| 7,192,334 B2 | 3/2007 | Hashimoto et al. |
| 2004/0017152 A1 | 1/2004 | Hashimoto et al. |
| 2005/0046342 A1* | 3/2005 | Park .................... H01L 27/3246 313/504 |

(Continued)

FOREIGN PATENT DOCUMENTS

| | | |
|---|---|---|
| CN | 1607879 A | 4/2005 |
| CN | 100347860 C | 11/2007 |

(Continued)

OTHER PUBLICATIONS

Publication No. KR 10-2007-0119234 A, dated Dec. 20, 2007, 1 page.

(Continued)

*Primary Examiner* — Vongsavanh Sengdara
(74) *Attorney, Agent, or Firm* — Lewis Roca Rothgerber Christie LLP

(57) ABSTRACT

An organic light emitting diode (OLED) display with an improved light efficiency and a method of manufacturing the OLED display are disclosed. The OLED display includes a substrate, an insulation layer on the substrate and having concave portions, first electrodes on the insulation layer, pixel defining layers (PDLs) on the insulation layer and configured to define the first electrodes into pixels, organic light emitting layers on the first electrodes as defined by the pixels, and a second electrode on the organic light emitting layers. Each of the concave portions includes a bottom surface and inclined parts. Each of the first electrodes is on the bottom surface and the inclined parts of one of the concave portions. Embossings are on a part of a surface of the PDLs.

22 Claims, 9 Drawing Sheets

(56) References Cited

U.S. PATENT DOCUMENTS

| | | | |
|---|---|---|---|
| 2008/0180024 A1* | 7/2008 | Kwon | H01L 27/3244 |
| | | | 313/504 |
| 2008/0303419 A1 | 12/2008 | Fukuda | |
| 2009/0174320 A1* | 7/2009 | Kim | H01L 27/3246 |
| | | | 313/504 |
| 2011/0175073 A1* | 7/2011 | Chang | H01L 51/5203 |
| | | | 257/40 |
| 2013/0001603 A1 | 1/2013 | Lim et al. | |

FOREIGN PATENT DOCUMENTS

| | | |
|---|---|---|
| JP | 2011-034717 A | 2/2011 |
| KR | 10-0822959 | 4/2008 |
| KR | 10-2010-0011102 A | 2/2010 |
| KR | 10-2011-0021260 A | 3/2011 |
| KR | 10-2011-0087433 A | 8/2011 |
| KR | 10-2013-0007421 | 1/2013 |

OTHER PUBLICATIONS

TIPO Office Action dated Mar. 11, 2016 for corresponding Taiwanese Patent application 101121256 (9 pages) with English translation (7 pages).

Chinese Office Action dated Jul. 5, 2016, with English translation, of the corresponding Chinese Patent Application No. 201210394870.2, noting listed references in this IDS (8 pages).

* cited by examiner

ORGANIC LIGHT EMITTING DEVICE AND MANUFACTURING METHOD THEREOF

CROSS-REFERENCE TO RELATED APPLICATION

This application claims priority to and the benefit of Korean patent Application No. 10-2012-0006169, filed in the Korean Intellectual Property Office on Jan. 19, 2012, the entire content of which is incorporated herein by reference.

BACKGROUND

1. Field

Embodiments of the present invention relate to an organic light emitting diode (OLED) display and a method of manufacturing the OLED display, and more particularly to an OLED display with an improved light efficiency and a method of manufacturing the OLED display.

2. Description of the Related Art

An OLED display is a self-light emitting display device for displaying an image with OLEDs for emitting light. Unlike a liquid crystal display, the OLED display requires no separate light resource, so that it is possible to reduce its relative thickness and weight. Further, the OLED display has high quality properties, such as low power consumption, high brightness, and high reaction speed, so it has drawn attention as a next generation display device for a portable electronic device.

The OLED is a diode that generates light when electrons and holes are combined and dissipated while emitting the light. The OLED includes an electrode for injecting holes, an electrode for injecting electrons, and a light emitting layer. The OLED has a lamination structure in which the light emitting layer is interposed between an anode that is the electrode for injecting the holes and a cathode that is the electrode for injecting the electrons.

In particular, the electrons that are injected in the cathode and the holes that are injected in the anode move toward each other by an external electric field and are then combined in the light emitting layer, so that they dissipate while emitting light. The light emitting layer of the OLED is formed of a single molecule organic material or a polymer.

SUMMARY

Embodiments of the present invention provide for an organic light emitting diode (OLED) display and a method of manufacturing the OLED display that restrains total reflection (total internal reflection) between the light emitting layer and the electrodes through forming embossings on pixel defining layers (PDLs) to improve visibility as well as light efficiency.

According to an exemplary embodiment of the present invention, an organic light emitting diode (OLED) display is provided. The OLED display includes: a substrate; an insulation layer on the substrate and having concave portions; first electrodes on the insulation layer; pixel defining layers (PDLs) on the insulation layer and configured to define the first electrodes into pixels; organic light emitting layers on the first electrodes as defined by the pixels; and a second electrode on the organic light emitting layers. Each of the concave portions includes a bottom surface and inclined parts. Each of the first electrodes is on the bottom surface and the inclined parts of one of the concave portions. Embossings are on a part of a surface of the PDLs.

The OLED display may further include a semiconductor device on the substrate and electrically connected to one of the first electrodes.

The semiconductor device may be a thin film transistor (TFT).

The side parts of the first electrodes may be on the inclined parts of the concave portions.

The side parts of the first electrodes may have a same angle of inclination as that of the inclined parts of the concave portions.

The side parts of the first electrodes may be covered by the PDLs.

The PDLs may cover the inclined parts of the concave portions.

The part of the surface of the PDLs may correspond to the inclined parts of the concave portions.

The organic light emitting layers may be on side parts of the PDLs adjacent to the first electrodes.

The part of the surface of the PDLs may correspond to the side parts of the PDLs.

The organic light emitting layers on the side parts of the PDLs may have same embossings as those of the PDLs.

The second electrode may have the same embossings as those of the organic light emitting layers.

The insulation layer may further include a first insulation layer having a flat surface and second insulation layers having the inclined parts.

The concave portions may be formed by the first insulation layer and the second insulation layers, the first insulation layer providing a bottom surface of the concave portions.

The embossings on the PDLs may be formed by a method selected from the group consisting of a rubbing process, a sand blast process, and a mask process.

An interval between the embossings may be between 10 nm and 1000 nm. According to an embodiment, the interval may be between 380 nm and 780 nm, which corresponds to the wavelength of visible light.

A depth of the embossings may be between 1 nm and 100 nm.

The OLED display may further include a first auxiliary light emitting layer between the first electrodes and the organic light emitting layers.

The first auxiliary light emitting layer may include at least one of a hole injection layer or a hole transfer layer.

The OLED display may further include a second auxiliary light emitting layer between the organic light emitting layers and the second electrode.

The second auxiliary light emitting layer may include at least one of an electron injection layer or an electron transfer layer.

According to another exemplary embodiment of the present invention, a method of manufacturing an organic light emitting diode (OLED) display is provided. The method includes: forming an insulation layer having concave portions on a substrate; forming first electrodes in the concave portions of the insulation layer, forming pixel defining layers (PDLs) on the insulation layer to divide the first electrodes into pixels having exposed first electrodes of the first electrodes; forming embossings on the PDLs; forming organic light emitting layers on the exposed first electrodes; and forming a second electrode on the organic light emitting layers.

The forming of the insulation layer having the concave portions may include: forming the insulation layer on a top surface of the substrate; and forming the concave portions in the insulation layer.

The forming of the insulation layer having concave portions may include forming inclined parts of the concave portions at positions corresponding to side parts of the first electrodes.

The forming of the first electrodes may include forming the side parts of the first electrodes to have a same angle of inclination to that of the inclined parts of the concave portions.

The forming of the PDLs on the insulation layer may include covering the side parts of the first electrodes.

The forming of the organic light emitting layers may include forming the organic light emitting layers on side parts of the PDLs adjacent to the first electrodes.

The method may further include forming same embossings on the organic light emitting layers formed on the side parts of the PDLs as those of the PDLs.

The method may further include forming the same embossings of the second electrode as those of the organic light emitting layers.

The forming of the insulation layer may include: forming a first insulation layer having a flat surface; and forming a second insulation layer having an inclined part.

The forming of the embossings on the PDLs may include a rubbing process, a sand blast process, or a mask process.

The forming of the embossings on the PDLs, the forming of the organic light emitting layers, and the forming of the second electrode may include: rubbing the PDLs to form the embossings; depositing the organic light emitting layers on the PDLs; and depositing the second electrode on the organic light emitting layers.

The forming of the embossings on the PDLs, the forming of the organic light emitting layers, and the forming of the second electrode may include: depositing a protective organic layer on the exposed first electrodes; performing a sand blast process to the PDLs; removing the protective organic layer after performing the sand blast process; depositing the organic light emitting layers on the PDLs; and depositing the second electrode on the organic light emitting layers.

The forming of the embossings on the PDLs, the forming of the organic light emitting layers, and the forming of the second electrode may include: exposing the PDLs through application of the mask process; depositing the organic light emitting layers on the PDLs; and depositing the second electrode on the organic light emitting layers.

The method may further include depositing a protective organic layer on the PDLs and the exposed first electrodes before the exposing of the PDLs.

The method may further include removing the protective organic layer after the exposing of the PDLs.

An interval between the embossings may be between 10 nm and 1000 nm. According to an embodiment, the interval may be between 380 nm and 780 nm, which corresponds to the wavelength of visible light.

A depth of the embossings may be between 1 nm and 100 nm.

The method may further include forming a first auxiliary light emitting layer between the first electrodes and the organic light emitting layers.

The method may further include forming a second auxiliary light emitting layer between the organic light emitting layers and the second electrode.

The forming of the second auxiliary light emitting layer may include forming at least one of an electron injection layer or an electron transfer layer.

Accordingly, in the OLED display according to an embodiment of the present invention, the PDLs formed on the inclined parts of the insulation layer and the side parts of the first electrode have the same angle of inclination and the embossings, so that it is possible to prevent or reduce the total reflection of the light generated from the inside of the OLED display, thereby improving the light efficiency.

Further, the OLED display according to an embodiment of the present invention can improve visibility from the side while having a relatively simple structure.

BRIEF DESCRIPTION OF THE DRAWINGS

The above and other features and aspects of the present invention will be more apparent from the following detailed description taken in conjunction with the accompanying drawings, in which.

DETAILED DESCRIPTION

Figure 1:
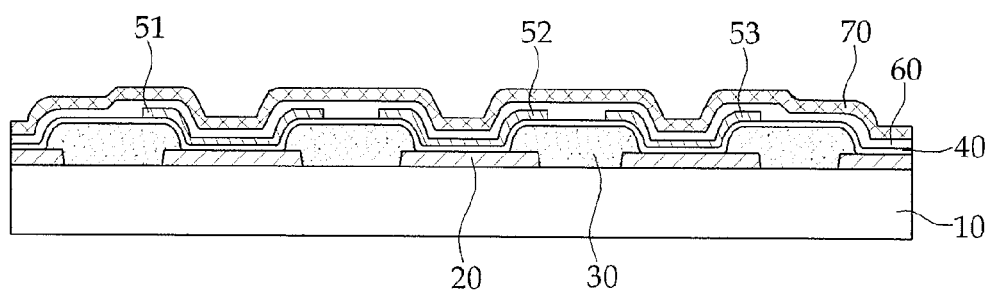
FIG. 1 is a view schematically illustrating a structure of an organic light emitting diode (OLED)

Hereinafter, exemplary embodiments of the present invention will be described with reference to the accompanying drawings.

The present invention may be variously modified and implemented in various forms, so specific embodiments are illustrated in the figures, and the present invention will be described based on the embodiments. However, it should be noted that the scope of the present invention is not limited by the below-described embodiments and the drawings. Further, it will be understood that all changes, equivalents, or substitutes included in the spirit and technical scope of the present invention are included in the scope of the present invention.

Although terms used herein are selected from widely used general terms as often as possible, several terms were selected by the applicant of the present invention depending on particular circumstances. In this case, the meaning of the terms selected by the applicant should be understood considering a meaning described or used in the detailed description of the present invention.

For the sake of simplicity, the description of parts that are not relevant to the present invention or well understood by those of ordinary skill in the art may be omitted for clarity. In the following description, the same or similar elements will be designated by the same reference numerals throughout the entire specification. Although the elements and their shapes are simplified or exaggerated in the drawings to help understanding of the present invention, the same reference numerals are used to designate the same or similar components.

In addition, when it is described that a layer or an element is located "above" or "on" another layer or element, it means not only that the layer or element may directly contact the other layer or element, but also that one or more third layers or elements may be interposed between them.

FIG. 1 schematically illustrates a general structure of an organic light emitting diode (OLED).

Referring to FIG. 1, the OLED includes anodes 20 serving as first electrodes on a base 10 for the OLED and the anodes are divided into pixels by pixel defining layers (PDLs) 30. A hole injection layer 40 is formed between the anodes 20 and the PDLs 30 and light emitting layers are formed on the hole injection layer 40. The light emitting layers are divided into a red light emitting layer 51, a green light emitting layer 52, and a blue light emitting layer 53. An electron transfer layer 60 is formed on the light emitting layers and a cathode 70 serving as a common electrode is formed on the electron transfer layer 60.

A hole transfer layer may be additionally disposed between the light emitting layers 51, 52, and 53 and the hole injection layer 40. In other embodiments, the hole transfer layer may be disposed in place of the hole injection layer 40. Further, an electron injection layer may be additionally disposed between the electron transfer layer 60 and the cathode 70. In other embodiments, the electron injection layer may be disposed in place of the electron transfer layer 60.

Figure 2:
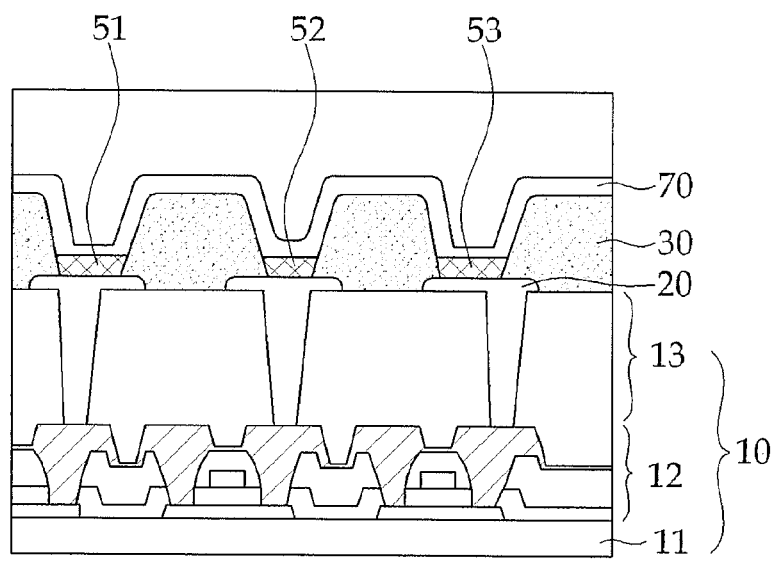
FIG. 2 is a view schematically illustrating the structures of an OLED.

FIG. 2 schematically illustrates the structures of the anodes 20, the light emitting layers 51, 52, and 53, the cathode 70, the PDLs 30, and the base 10 included in the OLED. Here, the base 10 includes a substrate 11, a thin film transistor (TFT) layer 12 formed on the substrate 11, and a flat insulation layer 13 formed on the TFT layer 12. In some contexts, a laminated body including the substrate 11, the TFT layer 12, and the flat insulation layer 13 may be referred to as the substrate.

As described above, the OLED display has a structure in which the anodes 20 and the cathode 70 are sequentially disposed on the flat insulation layer 13 covering the TFT layer 12 formed on the substrate and an organic layer having a multilayer structure is disposed between the anodes 20 and the cathode 70.

Meanwhile, in the OLED display, since light is partially reflected or undergoes total reflection (or total internal reflection) between the organic layer and the electrodes, an efficiency of emitting the light generated in the organic layer to the outside may be degraded. That is, in comparable OLEDs, approximately 23% of the generated light is lost due to the light reflection between the organic layer and the electrodes.

As one way of addressing the aforementioned problem of the comparable OLEDs, an OLED display having a resonant structure has been proposed. In this proposal, thicknesses of the organic layers in a red (R) pixel, a green (G) pixel, and a blue (B) pixel are controlled such that constructive interference of red light, green light, and blue light takes place to improve light efficiency.

However, in such an OLED display having the resonant structure, a color shift may be generated on a side surface due to the resonant structure, thus deteriorating visibility.

Figure 3:
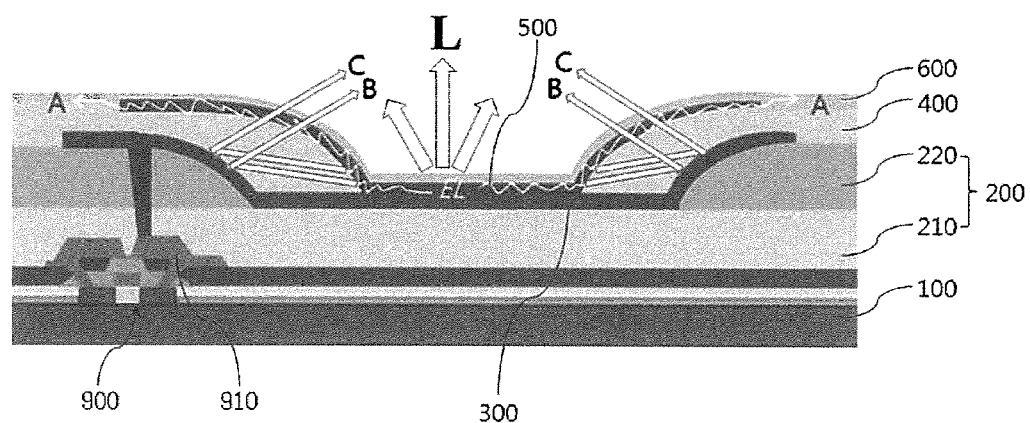
FIG. 3 is a view illustrating a light extraction mechanism in an OLED display according to an embodiment of the present invention.

FIG. 3 is a cross-sectional view schematically illustrating an OLED display according to an embodiment of the present invention.

As can be seen in FIG. 3, the OLED display includes a substrate 100, an insulation layer 200 disposed on the substrate 100 and having inclined parts (see, for example, the exposed sides of second insulation layer 220), first electrodes 300 disposed on the insulation layer 200, PDLs 400 disposed on the insulation layer 200 and configured to define the first electrodes 300 into pixels, organic light emitting layers 500 disposed on and corresponding to the first electrodes 300, and a second electrode 600 disposed on the organic light emitting layers 500. According to embodiments of the present invention, embossings (i.e., raised or lowered portions) are formed on a surface of the PDLs 400, but are not illustrated in FIG. 3.

FIG. 3 further illustrates a light extraction mechanism in the organic light emitting display according to an embodiment of the present invention.

In the OLED display of FIG. 3, light is generally generated in the organic light emitting layers 500 (indicated with the reference letters EL), and only approximately 30% of the generated light is emitted to the outside through a top surface (indicated with the reference letter L in FIG. 3) while the remaining 70% of the generated light is dissipated, mostly by the total reflection. For example, when a difference of reflective indexes between the organic light emitting layers and adjacent layers is satisfied, total reflection takes place and an optical waveguide may be formed in the organic light emitting layers 500. A large volume of the light generated in the organic light emitting layers 500 is then dissipated as heat while being propagated through the optical waveguide (indicated with the reference letter A in FIG. 3).

In order to reduce the quantity of dissipated light, embodiments of the present invention allow the light propagated through the optical waveguide to escape from the optical waveguide and be emitted to the outside. In order to make the light escape from the optical waveguide, embodiments of the present invention form inflection points in the optical waveguide. Specifically, embossings are formed between the organic light emitting layers forming the optical waveguide and the adjacent layers to serve as the inflection points. When the embossings are formed as described above, the light does not undergo total reflection in a region having the embossings that are the inflection points during the propagation through the optical waveguide. Accordingly, the light escapes the optical waveguide and is emitted to the outside.

As illustrated in FIG. 3, the light transferred through path A escapes to, for example, path B or path C at the region having the embossings that are the inflection points, is reflected by the first electrode serving as a reflective layer, and then is emitted through the top surface, so that light emitting efficiency is improved. That is, embodiments of the present invention change the paths of some of the light that might otherwise dissipate through path A and emits this redirected light to the outside, thereby improving the light emitting efficiency.

FIG. 3 also illustrates the general structure of the OLED display according to an embodiment of the present invention. Referring to FIG. 3, a semiconductor device 900 is formed on the substrate 100. For example, the semiconductor device 900 includes a TFT including a gate electrode, a source electrode, and a drain electrode. In FIG. 3, the first electrode 300 is an anode, and the first electrode 300 is electrically connected to a drain electrode 910 of the TFT. The semiconductor device 900 may be formed by a conventional method of manufacturing the TFT. Accordingly, a detailed method of manufacturing the semiconductor device 900 or the TFT will be omitted and any further description or indication of the semiconductor device 900 may be omitted for the convenience of description.

The insulation layer 200 is formed on an upper surface of the semiconductor device 900. In FIG. 3, the insulation layer 200 has a plurality of layers, namely, a first insulation layer 210 and the second insulation layer 220.

Figure 4:
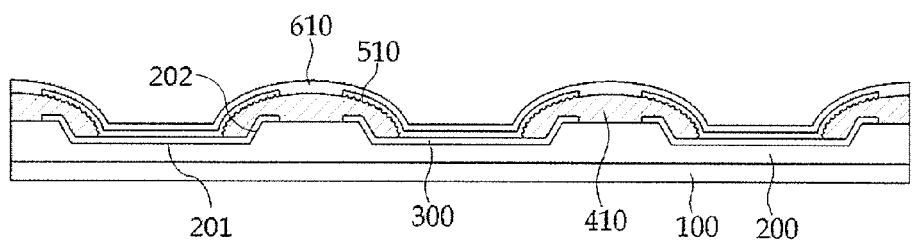
FIG. 4 is a view schematically illustrating a structure of an OLED display according to an embodiment of the present invention.
Figure 5:
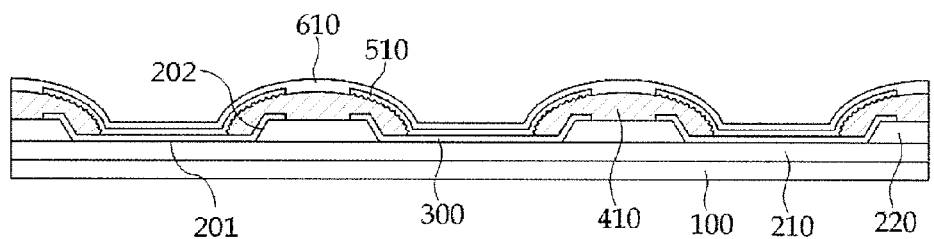
FIG. 5 is a view schematically illustrating a structure of an OLED display according to another embodiment of the present invention.

FIGS. 4 and 5 are cross-sectional views illustrating OLED displays according to embodiments of the present invention.

As illustrated in FIG. 4, the insulation layer 200 having inclined parts is disposed on the substrate 100. A transparent insulation substrate may be used as the substrate 100. For example, the substrate 100 may include a glass substrate, a quartz substrate, a transparent resin substrate, etc. The transparent resin substrate usable as the substrate 100 may include a polyimide resin, an acryl resin, a polyacrylate resin, a polycarbonate resin, a polyether resin, a polyethylene terephthalate resin, a sulphonic acid resin, etc., and combinations thereof.

According to one embodiment of the present invention, a lower structure including a switching device, a contact, a pad, a plug, an electrode, a conductive pattern, and an insulation pattern may be provided on the substrate 100. In this case, the insulation layer 200 may have a thickness enough to cover the lower structure.

The insulation layer 200 may be formed as a single structure as illustrated in FIG. 4, but may also be formed as a multilayer structure including at least two insulation layers as illustrated in FIG. 5. In FIG. 5, the insulation layer 200 includes the first insulation layer 210 and the second insulation layer 220 sequentially formed on the substrate 100. In this case, the first insulation layer 210 and the second insulation layer 220 may be formed of substantially the same or similar materials. In other embodiments, the first insulation layer 210 and the second insulation layer 220 may be formed of different materials.

According to embodiments of the present invention, in order to improve flatness of the insulation layer 200 formed on the substrate 100, a planarization process may be performed for the substrate 100. For example, the substrate 100 may have a flat surface (such as a flat upper surface) through an application of a chemical mechanical polishing (CMP) process, an etch-back process, etc., to the substrate.

According to embodiments of the present invention, the insulation layer 200 may include an organic material. For example, the insulation layer 200 may include a material selected from a photoresist, acryl-based polymer, polyimide-based polymer, polyamide-based polymer, siloxane-based polymer, polymer containing a photosensitive acryl carboxyl group, novolak resin, and alkali-developable resin, and combinations thereof.

According to other embodiments of the present invention, the insulation layer 200 may be formed of an inorganic material, such as a silicon compound, a metal, a metal oxide, etc. For example, the insulation layer 200 may include a material selected from silicon oxide (SiOx), silicon nitride (SiNx), silicon oxy-nitride (SiOxNy), silicon oxycarbide (SiOxCy), silicon carbide nitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), and zirconium oxide (ZrOx), and combinations thereof.

The insulation layer 200 may be formed on the substrate 100 by using a spin coating process, a printing process, a sputtering process, a chemical vapor deposition (CVD) process, an atomic layer deposition (ALD) process, a plasma enhanced chemical vapor deposition (PECVD) process, a high density plasma chemical vapor deposition (HDP-CVD) process, or a vacuum deposition process depending on the materials used.

As illustrated in FIG. 4, the insulation layer 200 has concave portions. When the insulation layer 200 has the concave portions, the OLED display including the insulation layer 200 may employ a top emitting method. The concave portion has a concavely depressed bottom surface 201 and inclined parts 202 that are the side parts thereof having an inclination.

Meanwhile, in FIG. 5, the concave portion is formed by the first insulation layer 210 and the second insulation layer 220. In this case, the first insulation layer 210 forms the bottom surface 201 and a side surface of the second insulation layer 220 forms the inclined part 202.

The first electrodes 300 are formed on the insulation layer 200 having the inclined parts 202. The first electrode 300 is formed over the inclined parts 202 that are the side parts of the concave portion and the bottom surface 201. That is, the side parts of the first electrode 300 may be formed on the inclined parts of the concave portion (as such, the inclined parts of the concave portion are formed at positions corresponding to the side parts of the first electrode 300). Accordingly, the side parts of the first electrode 300 positioned on the inclined parts 202 may have an angle of inclination actually the same as or similar to that of the inclined part of the concave portion. For example, the angle of inclination of the side part of the first electrode 300 positioned on the inclined part 202 may be approximately 20° to 70° with respect to a direction substantially parallel to the surface of the substrate 10.

When the OLED display employs the top emitting method, the first electrode 300 may be formed of a material having a reflection property. For example, the first electrode 300 may include a material selected from a metal, such as aluminum, silver, platinum, gold (Au), chrome, tungsten, molybdenum, titanium, palladium (Pd), iridium (Ir) and an alloy thereof, which may be used exclusively or combined with other structures for use as the first electrode 300. For example, the first electrode 300 may be formed as a single structure or a multilayer structure including the aforementioned metal and/or alloy.

According to embodiments of the present invention, the first electrodes 300 may be formed on some parts of the insulation layer 200 through forming a first electrode layer on a top surface of the insulation layer 200 and then patterning the first electrode layer. In this case, the first electrode layer may be formed using the material of the first electrode 300 through a method, such as a sputtering process, a vacuum deposition process, a chemical vapor deposition process, a pulse laser deposition process, a printing process, or an atomic layer deposition process. The first electrode 300 may extend to a part of a non-luminescent region adjacent to a luminescent region of the OLED display as described later.

According to other embodiments, a through-hole extending through the insulation layer 200 to the semiconductor device (see, for example, the semiconductor device 900 of FIG. 3) may be formed in the insulation layer 200. A part of the semiconductor device is exposed through the through-hole, and for example, a contact structure or a pad structure is formed on the inside of the through-hole and the exposed semiconductor device (e.g., the TFT) and the first electrode 300 formed on the insulation layer 200 is connected to the contact structure or the pad structure. Accordingly, the first electrode 300 may be electrically connected to the semiconductor device through the contact structure or the pad structure.

Next, the PDLs 400 are formed on the insulation layer 200 and the first electrode layers 300. See, for example, PDLs 400 of FIG. 3 and PDLs 410 of FIGS. 4-5. The PDLs 400 may be formed of an organic material or an inorganic material. For example, the PDLs 400 may include a material selected from an organic material, such as a photoresist, polyacryl-based resin, polyimide-based resin, and acryl-based resin, and an inorganic material, such as a silicon compound.

A material for forming the PDLs is entirely applied on the first electrodes 300 and the insulation layer 200 and the first electrodes 300 and the insulation layer 200 are partially etched, to form the PDLs 400 such that a part of the first electrodes 300 are exposed. For example, the first electrode 300 may be exposed using a photolithography process or an etching process using an additional etching mask to produce exposed electrodes. In exemplary embodiments, a side wall of an opening of the PDLs 400 may have an angle of inclination substantially the same as or similar to that of the inclined part of the insulation layer. For example, the sidewall of the opening of the PDLs 400 may have an angle of inclination of 20° to 70° with respect to a direction substantially parallel to the substrate 100.

According to the forming of the PDLs 400, a luminescent region and a non-luminescent region of the OLED display are defined. That is, a region without the PDLs 400 corresponds to the luminescent region and a region including the PDLs 400 corresponds to the non-luminescent region.

In FIGS. 4 and 5, the luminescent region is positioned to correspond to the concave portion of the insulation layer 200 and the first electrode 300. The luminescent region is uniformly formed on the bottom surface 201 and the inclined parts 202 of the concave portion.

The PDLs 400 are formed between the first electrodes 300 and extend up to a part of the luminescent region. As a result, the PDLs 400 are formed on a part of the bottom surface 201 of the first electrode 300 and on the sidewall of the inclined part 202 of the first electrode 300.

That is, the PDLs 400 in the luminescent region are also formed on the inclined part that is the side part of the first electrode 300. Accordingly, the part (i.e. the sidewall of the opening) of the PDLs 400 positioned in the luminescent region has an inclined angle substantially the same as or similar to that of the inclined part 202. For example, the PDLs 400 positioned in the luminescent region may be disposed on a part of the first electrode 300 with an angle of inclination of approximately 20° to 70° with respect to an axis substantially parallel to the substrate 100.

After forming of the PDLs 400 as described above, the embossings are formed on the surface of the PDLs 400. The embossings of the surface of the PDLs 400 may be formed by a pattern forming method, such as a rubbing process, a sand blasting process (or sand blast process), or a mask process (e.g., a random mask process). For example, the embossings of the PDLs 400 may substantially have various plane shapes, such as the shape of a circle, an oval, a diamond, or a triangle. Further, the embossings may substantially have various three-dimensional shapes, such as the shape of a bar or a hexahedron. A method of forming the embossings on the PDLs 400 will be described later with reference to FIGS. 6A to 8D. A surface of the PDLs 400 at a position corresponding to at least the inclined parts 202 of the concave portion is provided with the embossings.

Next, the organic light emitting layers 500 (see, for example, the organic light emitting layers 500 of FIG. 3 and organic light emitting layers 510 of FIGS. 4-5) are formed on the exposed first electrodes 300 and the PDLs 400. The organic light emitting layers 500 may be formed of light emitting materials capable of emitting light of different colors, such as red light, green light, and blue light, depending on each pixel of the OLED display. According to another embodiment, the organic light emitting layers 500 may have a multilayer structure in which multiple light emitting materials capable of emitting light of different colors, such as red light, green light, and blue light, are laminated to emit white light. According to another embodiment, the organic light emitting layers 500 may additionally include a host material having a substantially larger band gap than the light emitting materials.

According to embodiments of the present invention, the organic light emitting layer 500 is positioned on the first electrode 300 formed in the concave portion. Further, the organic light emitting layer 500 extends between the first electrode 300 in the luminescent region and the side part of the PDLs 400 having the embossings. That is, as illustrated in FIGS. 4 and 5, a bottom surface of the organic light emitting layer 510 is positioned on the first electrode 300 and the side parts of the organic light emitting layer 510 are in contact with the PDLs 410. Accordingly, the side part of the organic light emitting layer 510 has an angle of inclination substantially the same as or similar to that of the inclined part 202. For example, the side part of the organic light emitting layer 510 may have an angle of inclination of approximately 20° to 70° with respect to the surface substantially parallel to the surface of the substrate 100.

According to embodiments of the present invention, a first auxiliary light emitting layer may be formed between the first electrode 300 and the organic light emitting layer 500. In this case, the first auxiliary light emitting layer may include at least one of a hole injection layer or a hole transfer layer. Further, a second auxiliary light emitting layer may be formed between the second electrode 600 (see, for example, the second electrode 600 of FIG. 3 and second electrode 610 of FIGS. 4-5) and the organic light emitting layer 500. In this case, the second auxiliary light emitting layer may include at least one of an electron injection layer or an electron transfer layer.

Next, the second electrode 600 is formed on the organic light emitting layers 500 and the PDLs 400. The second electrode 600 may be formed on the organic light emitting layers 500 and the PDLs 400 with a uniform or nonuniform thickness. When the OLED display employs the top emitting method, the second electrode 600 may be formed of a light transmitting conductive material. For example, the second electrode 600 may include at least one of an indium tin oxide, an indium zinc oxide, a zinc tin oxide, a zinc oxide, a tin oxide, or a gallium oxide, or combinations thereof.

According to embodiments of the present invention, the second electrode 600 extends from the luminescent region to the non-luminescent region. According to other embodiments, the second electrode 600 may be positioned only on the luminescent regions. For example, the second electrode 600 may be disposed on the organic light emitting layer 500 and on a part of the PDLs 400 (that is, on the side part of the PDLs 400). In this event, the second electrode 600 may be selectively disposed only in the luminescent regions by forming a second electrode layer (not shown) on the entire surfaces of the organic light emitting layer 500 and the PDLs 400, and then patterning the second electrode layer.

The second electrode 600 in the luminescent region may have an angle of inclination substantially the same as or similar to that of the inclined part 202 of the insulation layer 200. For example, the side part of the second electrode 600 positioned on the PDLs 400 in the luminescent region may have an angle of inclination of approximately 20° to 70° with respect to a direction substantially parallel to the surface of the substrate 100.

FIGS. 6A to 6F schematically illustrate an exemplary process of manufacturing the OLED display according to an embodiment of the present invention.

In FIGS. 6A to 6F, the OLED display is described based on an exemplary case in which the insulation layer 200 includes the first insulation layer 210 and the second insulation layer 220. That is, the first insulation layer 210 is first formed on the substrate 100 (see FIG. 6A). The second insulation layer 220 having the inclined part 202 is then formed on the first insulation layer 210 formed on the substrate 100 (see FIG. 6B). In order to form the second insulation layer 220 having the inclined part 202, the second insulation layer 220 is first formed on a top surface of the first insulation layer 210 and then the second insulation layer 220 is partially removed, so that a plurality of concave portions having the bottom surfaces 201 and the inclined parts 202 are formed.

Figure 6A:
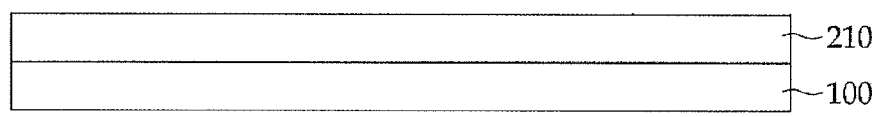
FIGS. 6A to 6F are cross-sectional views for illustrating a method of manufacturing an OLED display according to an embodiment of the present invention.
Figure 6B:
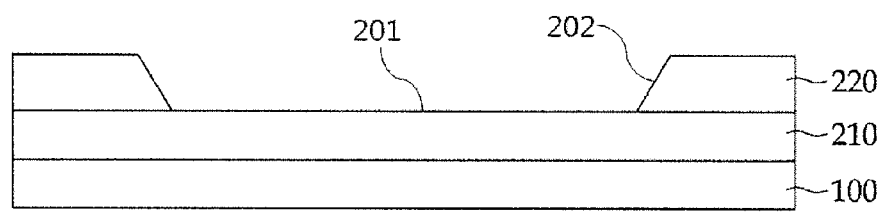

As illustrated in FIG. 6B, when the second insulation layer 220 is partially removed, the second insulation layer 220 is partially removed up to a part that is in contact with the first insulation layer 210 (corresponding to the bottom surface 201), and a side surface of the removed part has an inclination (corresponding to the inclined part 202). The concave portion is formed through the partial removal of the second insulation layer 220 and the side part of the concave portion is provided with the inclined part 202. Here, the bottom surface 201 of the concave portion coincides with the first insulation layer 210 (that is, the second insulation layer 220 is completely removed at a position corresponding to the bottom surface 201).

Figure 6C:
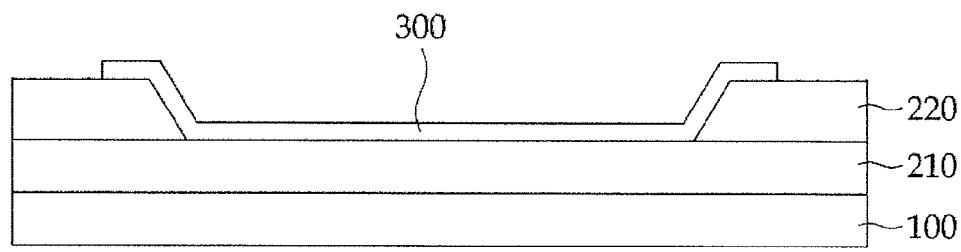

Subsequently, the first electrode 300 is formed over the bottom surface 201 and the inclined parts 202 of the concave portion (see FIG. 6C). In the example illustrated in FIG. 6C, the first electrode 300 is formed on the entirety of the bottom surface 201 and the inclined parts 202 of the concave portion, and ends of the first electrode 300 extend on the insulation layer (that is, the second insulation layer 220). Here, the part of the first electrode 300 formed on the inclined part 202 of the concave portion is referred to as a side part of the first electrode 300, while the part of the first electrode 300 formed on the bottom surface 201 is referred to as a bottom part of the first electrode 300.

Figure 6D:
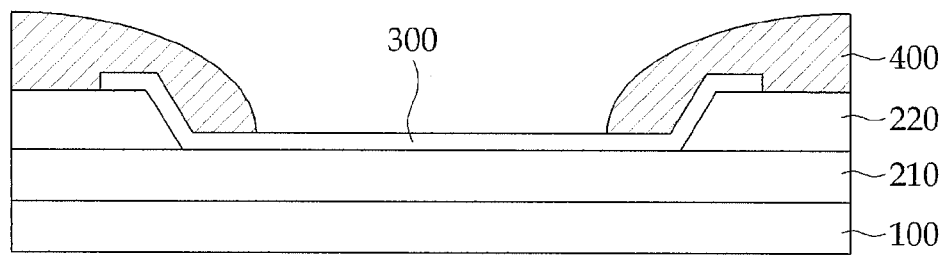

Next, the PDLs 400 are formed such that the first electrodes 300 are divided into pixels (see FIG. 6D). As shown in FIG. 6D, the PDLs 400 extend between (i.e., in a horizontal direction) and cover the upper surface of the insulation layer (that is, the second insulation layer 220) and the side part of the first electrode 300, and continue to extend to a portion of the bottom part of the first electrode 300. A region that is not covered by the PDLs 400 is referred to as an opening part or an opening part of the first electrode 300.

Figure 6E:
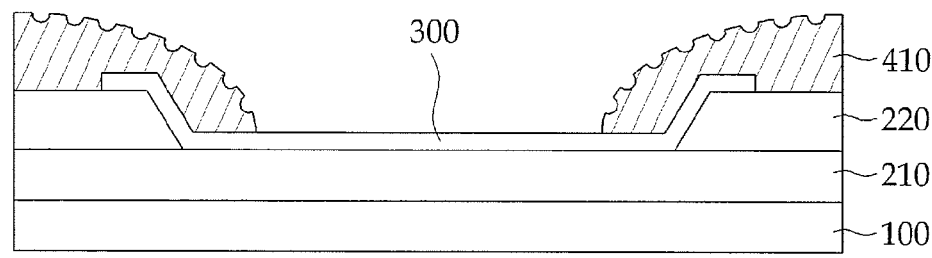
Figure 6F:
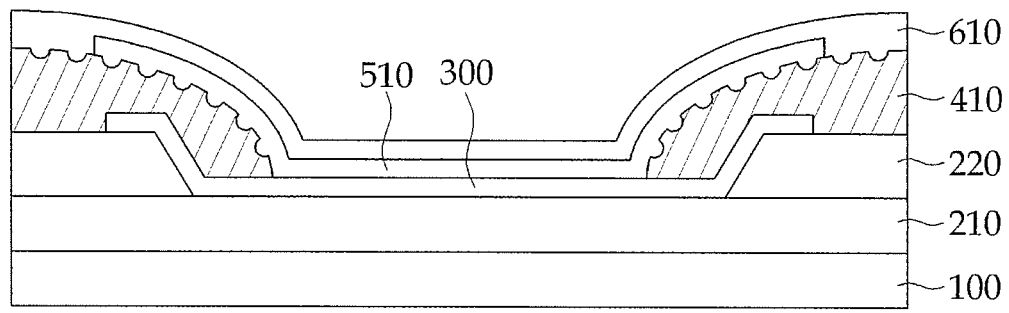

FIGS. 6D to 6F are views for illustrating a method of forming the embossings on the surface of the PDLs 400 through a rubbing process.

Referring to FIGS. 6D to 6E, the embossings are formed on the PDLs 400 through a rubbing process to yield embossed PDLs 410 (see FIG. 6E). The rubbing process may be performed with the conventional procedures executed in the technical field to which the present invention pertains. For example, the rubbing process may be performed using a rubbing roll wounded with rubbing cloths. Intervals between the embossings and depths of the embossings may be differently formed depending on a type of rubbing cloths used, a rubbing direction, and a rubbing speed. In the present embodiment, cotton is used as the rubbing cloths. A space between the formed embossings is in a range from 300 nanometers (nm) to 400 nm, and is approximately 600 nm in a case of the application of a reverse rotation, but the range of the interval between the embossings is not limited thereto. For example, in other embodiments, the interval between the embossings may be between 10 nm and 1000 nm, and a depth of the embossings may be between 1 nm and 100 nm. In another embodiment, the interval may be between 380 nm and 780 nm, which corresponds to the wavelength of visible light.

Next, as illustrated in FIG. 6F, the organic light emitting layer 510 is formed on the PDLs 410 provided with the embossings. In this case, the organic light emitting layer 510 may have embossings having the same shape as those formed on the embossed PDLs 410. Further, the second electrode 610 is formed on the PDLs 410 including the embossings and the organic light emitting layer 510. Although it is not illustrated, the same embossings as those formed on the PDLs 410 may be formed on the organic light emitting layer 510 contacting the second electrode 610. In the same manner, the second electrode 610 may have the embossings having the same shape as those formed on the organic light emitting layer 510.

FIGS. 7A to 7E are views for illustrating a process of forming the embossings on the surface of the PDLs 400 through a sand blasting process.

Figure 7A:
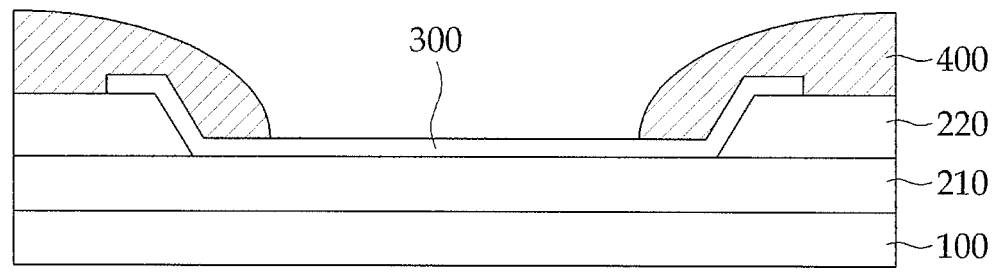
FIGS. 7A to 7E are cross-sectional views for illustrating a method of manufacturing an OLED display according to another embodiment of the present invention.
Figure 7B:
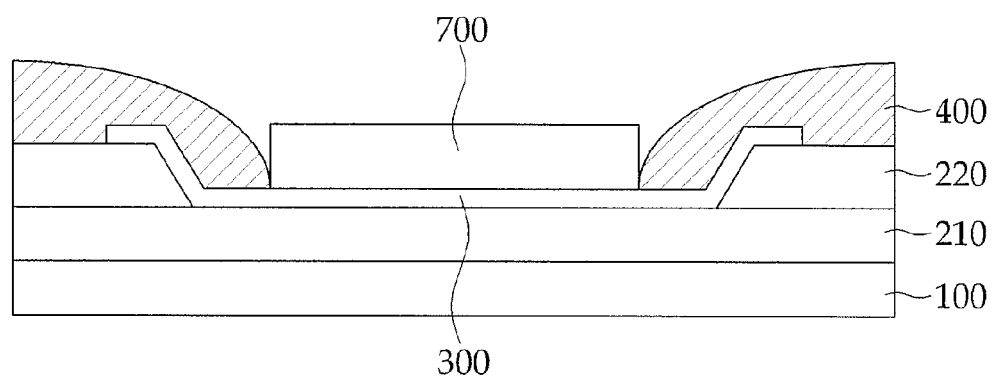

Referring to FIGS. 7A to 7B, after performing the steps up to the forming of the PDLs 400 as described above (see, for example, FIGS. 6A-6D and accompanying description), a protective organic layer 700 is formed on the exposed part of the first electrode 300 (see FIG. 7B). This is to prevent the first electrode 300 from being damaged due to the sand blasting process. The protective organic layer 700 may be formed of a material generally used for forming of an organic layer.

Figure 7C:
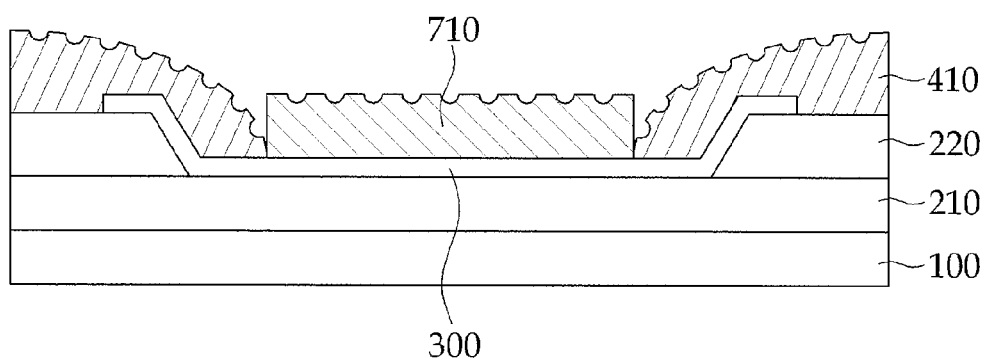

Referring to FIG. 7C, the embossings are formed on the PDLs 400 and the protective organic layer 700 through the sand blasting process to yield embossed PDLs 410 and embossed protective organic layer 710. Here, the sand blasting process may be performed with the procedures generally executed in the technical field to which the present invention pertains. For example, the embossings may be formed through the steps of aligning a metal mask for forming a pattern on an upper surface of the PDLs 400, arranging a plurality of nozzles in a uniform interval on an upper surface of the metal mask for forming the pattern, and selectively polishing the PDLs 400 by using an abrasive sprayed through the nozzles to form a desired pattern.

Figure 7D:
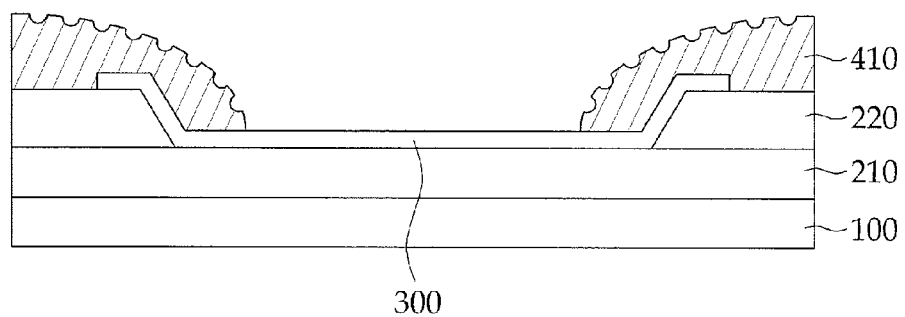

Next, as illustrated in FIG. 7D, after the completion of the sand blasting process, the protective organic layer 710 provided with the embossings is removed.

Figure 7E:
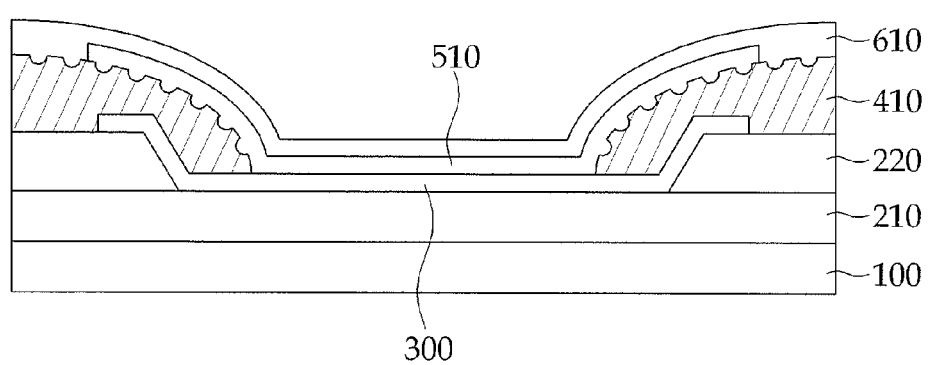

Then, referring to FIG. 7E, the organic light emitting layer 510 is formed on the PDLs 410 having the embossings and the first electrode 300. In this case, the organic light emitting layer 510 may have the embossings having the same shape as those formed on the embossed PDLs 410. Further, the second electrode 610 is formed on the PDLs 410 having the embossings and the organic light emitting layer 510. Although it is not illustrated, the same embossings as those formed on the embossed PDLs 410 may be formed on the surface of the organic light emitting layer 510 contacting the second electrode 610, and in the same manner, the second electrode 610 may have the embossings having the same shape as those formed on the organic light emitting layer 510.

FIGS. 8A to 8D illustrate a process of forming the embossings on the surface of the PDLs 400 by using a mask.

Figure 8A:
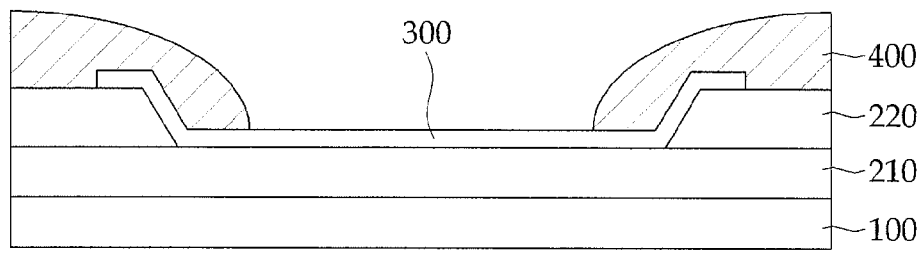
FIGS. 8A to 8D are cross-sectional views for illustrating a method of manufacturing an OLED display according to yet another embodiment of the present invention.
Figure 8B:
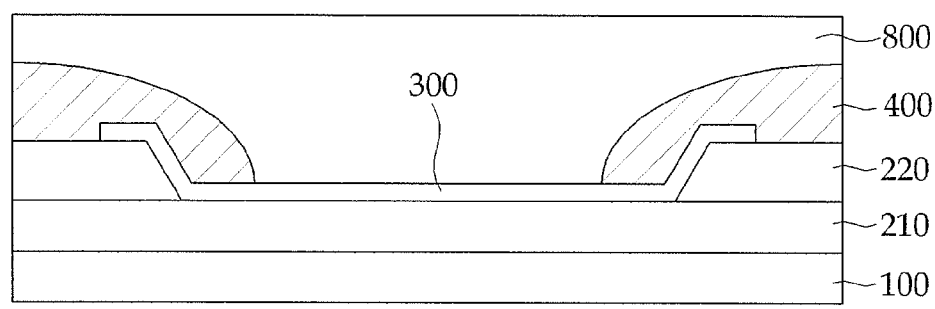

Referring to FIGS. 8A to 8B, after forming the PDLs 400 as described above (see, for example, FIGS. 6A-6D and accompanying description), a protective organic layer 800 is formed to entirely cover the PDLs 400 and the exposed first electrode 300 (see FIG. 8B). This is to prevent the first electrode from being damaged due to a mask process. The protective organic layer 800 may be generally formed of a material used for forming an organic layer.

Figure 8C:
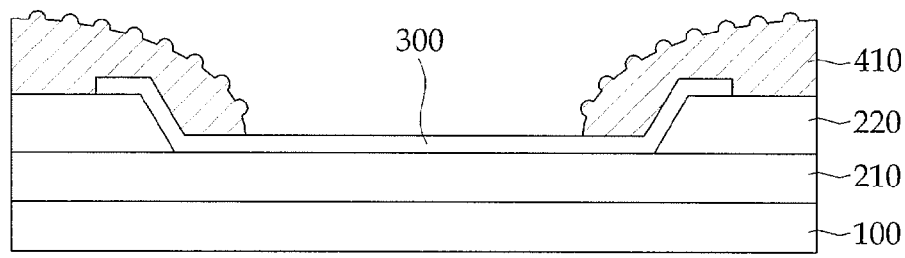

Referring to FIG. 8C, the embossings are formed on the PDLs 400 through the mask process to yield embossed PDLs 410, and the protective organic layer 800 is removed. Here, the mask process may be performed with the procedures generally executed in the technical field to which the present invention pertains.

Figure 8D:
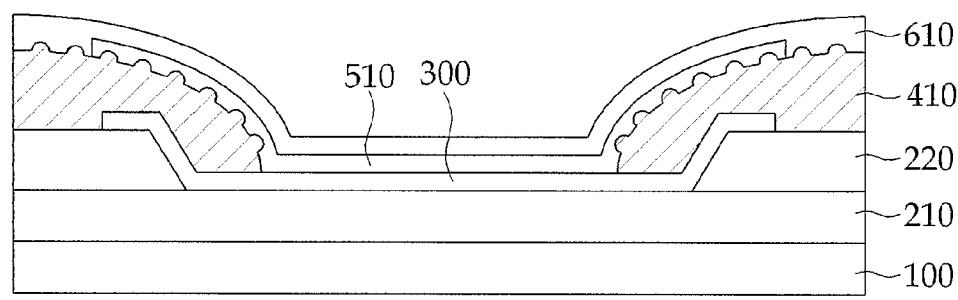

As illustrated in FIG. 8D, the organic light emitting layer 510 is formed on the PDLs 410 having the embossings and the first electrode 300. In this case, the organic light emitting layer 510 may have the embossings having the same shape as those formed on the embossed PDLs 410. Further, the second electrode 610 is formed on the PDLs 410 having the embossings and the organic light emitting layer 510. Although it is not illustrated, the same embossings as those formed on the embossed PDLs 410 may be formed on the surface of the organic light emitting layer 510 contacting the second electrode 610. In the same manner, the second electrode 610 may have the embossings having the same shape as those formed on the organic light emitting layer 510.

In comparable OLED displays including a lower electrode, an organic light emitting layer, and an upper electrode, since light generated from the organic light emitting layer undergoes total reflection (e.g., total internal reflection) between the organic light emitting layer and the upper and lower electrodes, at least 20% of the generated light is lost.

Contrary to this, according to embodiments of the present invention, the side parts of the organic light emitting layer 500, the first electrode 300, and the second electrode 600 have the angle of inclination, through which the total reflection of the light generated from the organic light emitting layers can be reduced or prevented, according to the inclined parts. In addition, even the light loss through the side parts may be reduced or prevented through the PDLs 400 having the embossings, as well as the organic light emitting layer 500 and the second electrode 600. Accordingly, the OLED display according to embodiments of the present invention may achieve light efficiency with an improvement of at least 38% compared to comparable OLED displays.

Further, since the OLED display according to embodiments of the present invention does not need to have a relatively complicated construction for the optical resonance of the light generated from the organic light emitting layer 500, it is possible to have a simpler structure compared to comparable OLED displays having the optical resonant structure. This also allows the OLED display of embodiments of the present invention to achieve a more improved side visibility when compared to comparable OLED displays having the optical resonant structure.

Although the embodiments of the present invention have been described with reference to the accompanied drawings, those skilled in the art will appreciate that various modifications, additions, and substitutions are possible, without changing the technical spirit and the features of the present invention as disclosed in the accompanying claims. Accordingly, it should be appreciated that the aforementioned embodiments are illustrative and are not limited in all aspects.

What is claimed is:

1. An organic light emitting diode (OLED) display, comprising:
    a substrate;
    an insulation layer on the substrate and having concave portions;
    first electrodes on the insulation layer;
    pixel defining layers (PDLs) on the insulation layer and configured to define the first electrodes into pixels, the first electrodes being separated by first boundary surfaces between the insulation layer and the PDLs;
    organic light emitting layers on the first electrodes as defined by the pixels; and
    a second electrode on the organic light emitting layers,
    wherein
        each of the concave portions includes a bottom surface and inclined parts,
        each of the first electrodes is on the bottom surface and the inclined parts of one of the concave portions,
        the organic light emitting layers include extended portions extending away from the first electrode and disposed between the PDLs and the second electrode, the extended portions being separated by second boundary surfaces between the PDLs and the second electrode,
        the PDLs have embossings at third boundary surfaces between the PDLs and the extended portions of the organic light emitting layers,
        the first boundary surfaces face the second boundary surfaces, and
        the second boundary surfaces have a curved shape where they overlap the first boundary surfaces.

2. The OLED display as claimed in claim 1, further comprising a semiconductor device on the substrate and electrically connected to one of the first electrodes.

3. The OLED display as claimed in claim 2, wherein the semiconductor device is a thin film transistor (TFT).

4. The OLED display as claimed in claim 1, wherein side parts of the first electrodes are on the inclined parts of the concave portions.

5. The OLED display as claimed in claim 4, wherein the side parts of the first electrodes have a same angle of inclination as that of the inclined parts of the concave portions.

6. The OLED display as claimed in claim 4, wherein the side parts of the first electrodes are covered by the PDLs.

7. The OLED display as claimed in claim 1, wherein the PDLs cover the inclined parts of the concave portions.

8. The OLED display as claimed in claim 7, wherein the embossings of the PDLs correspond to the inclined parts of the concave portions.

9. The OLED display as claimed in claim 1, wherein the extended portions of the organic light emitting layers are on side parts of the PDLs adjacent to the first electrodes.

10. The OLED display as claimed in claim 9, wherein the embossings of the PDLs correspond to the side parts of the PDLs.

11. The OLED display as claimed in claim 10, wherein the extended portions of the organic light emitting layers on the side parts of the PDLs have same embossings as those of the PDLs.

12. The OLED display as claimed in claim 11, wherein the second electrode has the same embossings as those of the organic light emitting layers.

13. The OLED display as claimed in claim 1, wherein the insulation layer further comprises a first insulation layer having a flat surface and second insulation layers having the inclined parts.

14. The OLED display as claimed in claim 13, wherein the concave portions are formed by the first insulation layer and the second insulation layers, the first insulation layer providing the bottom surface of the concave portions.

15. The OLED display as claimed in claim 1, wherein the embossings of the PDLs are formed by a method selected from the group consisting of a rubbing process, a sand blast process, and a mask process.

16. The OLED display as claimed in claim 1, wherein an interval between the embossings is between 10 nm and 1000 nm.

17. The OLED display as claimed in claim 1, wherein a depth of the embossings is between 1 nm and 100 nm.

18. The OLED display as claimed in claim 1, further comprising a first auxiliary light emitting layer between the first electrodes and the organic light emitting layers.

19. The OLED display as claimed in claim 18, wherein the first auxiliary light emitting layer comprises at least one of a hole injection layer or a hole transfer layer.

20. The OLED display as claimed in claim 1, further comprising a second auxiliary light emitting layer between the organic light emitting layers and the second electrode.

21. The OLED display as claimed in claim 20, wherein the second auxiliary light emitting layer comprises at least one of an electron injection layer or an electron transfer layer.

22. The OLED display as claimed in claim 1, wherein the organic light emitting layers have embossings at surfaces of the light emitting layers contacting the second electrode.

* * * * *